(12) United States Patent
Kumakura et al.

(10) Patent No.: US 10,020,373 B1
(45) Date of Patent: Jul. 10, 2018

(54) SEMICONDUCTOR DEVICE

(71) Applicant: Sanken Electric Co., Ltd., Saitama (JP)

(72) Inventors: Hiromichi Kumakura, Saitama (JP); Tomonori Hotate, Saitama (JP); Hiroko Kawaguchi, Saitama (JP); Hiroshi Shikauchi, Saitama (JP); Ryohei Baba, Saitama (JP); Yuki Tanaka, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 15/450,008

(22) Filed: Mar. 5, 2017

(30) Foreign Application Priority Data

Feb. 22, 2017 (JP) .................................. 2017-031102

(51) Int. Cl.
*H01L 29/40* (2006.01)
*H01L 29/47* (2006.01)
*H01L 23/31* (2006.01)
*H01L 23/528* (2006.01)
*H01L 23/532* (2006.01)

(52) U.S. Cl.
CPC .......... *H01L 29/47* (2013.01); *H01L 23/3171* (2013.01); *H01L 23/5283* (2013.01); *H01L 23/53295* (2013.01)

(58) Field of Classification Search
CPC . H01L 29/47; H01L 23/3171; H01L 23/5283; H01L 23/53295

USPC ......................................................... 257/484
See application file for complete search history.

(56) References Cited

U.S. PATENT DOCUMENTS

| 7,262,078 B2* | 8/2007 | Lai | ................... | B81C 1/00365 |
| | | | | 257/E21.508 |
| 2004/0222522 A1* | 11/2004 | Homma | ............... | H01L 21/563 |
| | | | | 257/737 |
| 2015/0255362 A1 | 9/2015 | Konrath et al. | | |
| 2016/0093748 A1* | 3/2016 | Mieczkowski | ..... | H01L 29/0619 |
| | | | | 257/77 |

FOREIGN PATENT DOCUMENTS

JP          2015-170857 A      9/2015

* cited by examiner

*Primary Examiner* — Vu A Vu
(74) *Attorney, Agent, or Firm* — Hawaii Patent Services; Nathaniel K. Fedde; Kenton N. Fedde

(57) ABSTRACT

Provided is a highly reliable semiconductor device that uses a thick passivation layer. The protective film is formed so as to cover mostly the entire surface of a semiconductor substrate, and is open only in an area of part that is above a metal wiring layer (connection area). The passivation layer includes starting from the bottom side, a first silicon nitride film that includes silicon nitride ($Si_3N_4$), a silicon oxide film that includes silicon oxide ($SiO_2$), and an organic film (organic layer) that includes a polyimide. The silicon oxide film and organic film are formed so as to cover the electrode layer (metal wiring layer) except the top of the insulation layer and the connection area, however, the first silicon nitride film is formed only on the insulation layer and not formed on the electrode layer.

10 Claims, 5 Drawing Sheets

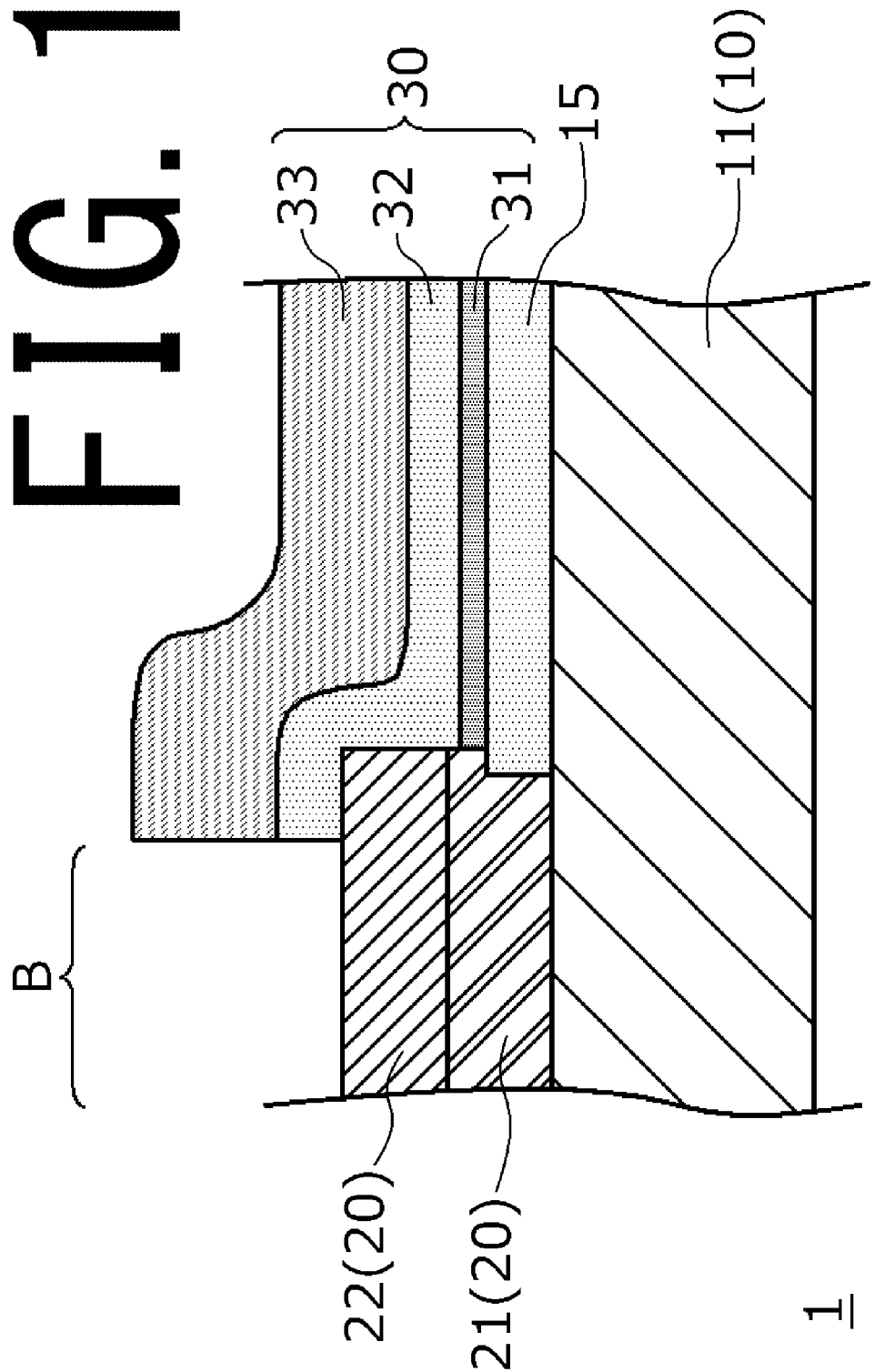

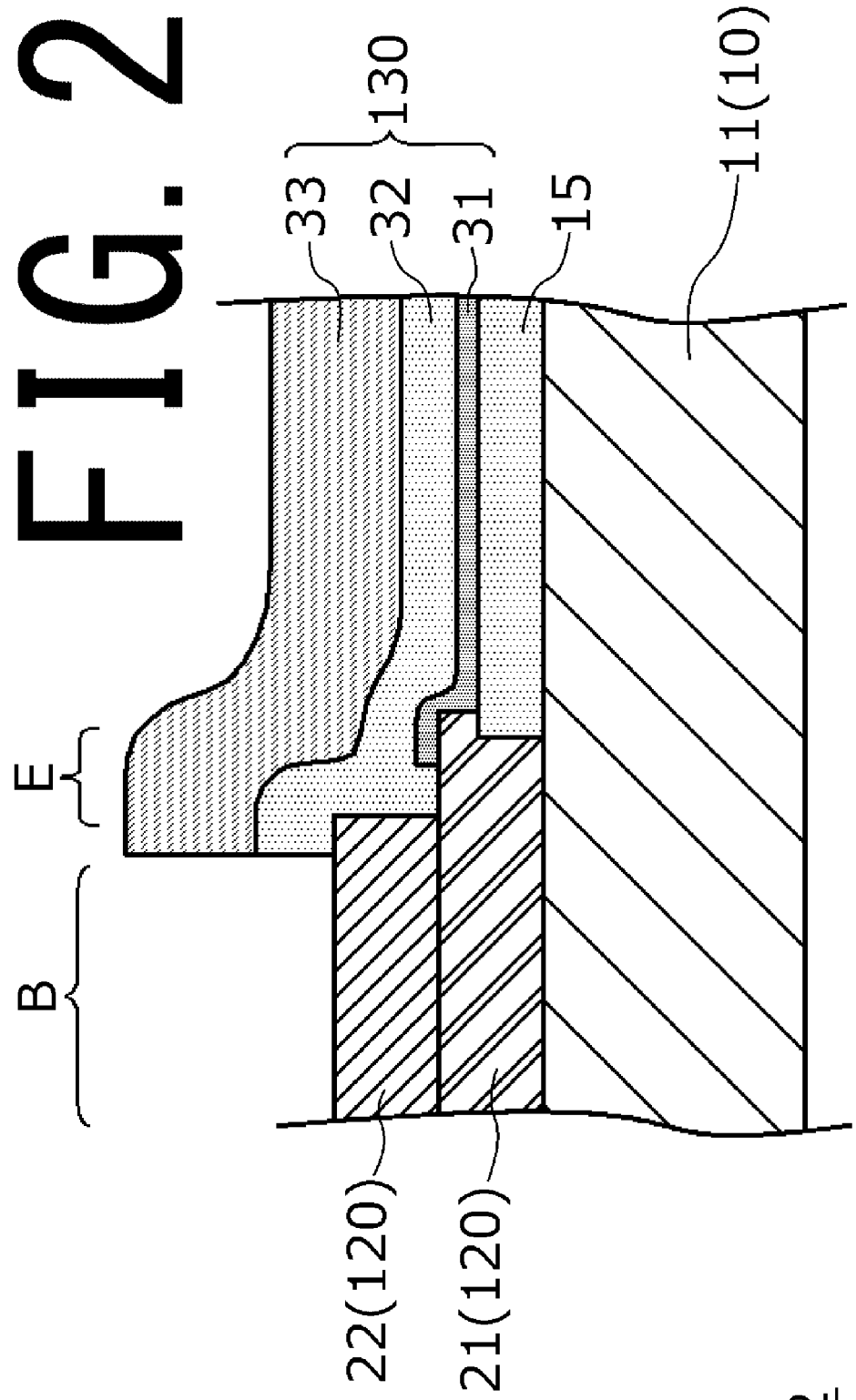

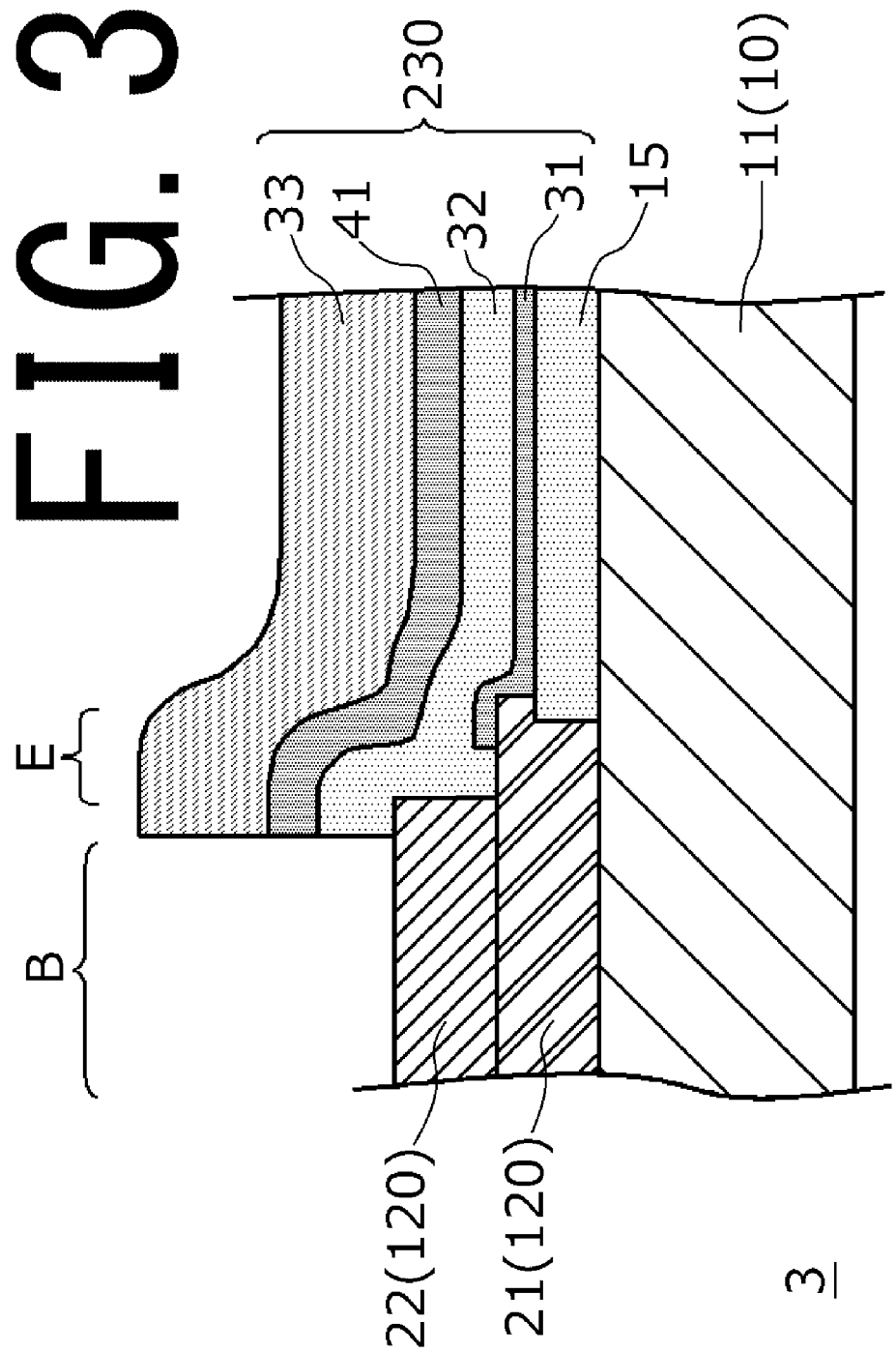

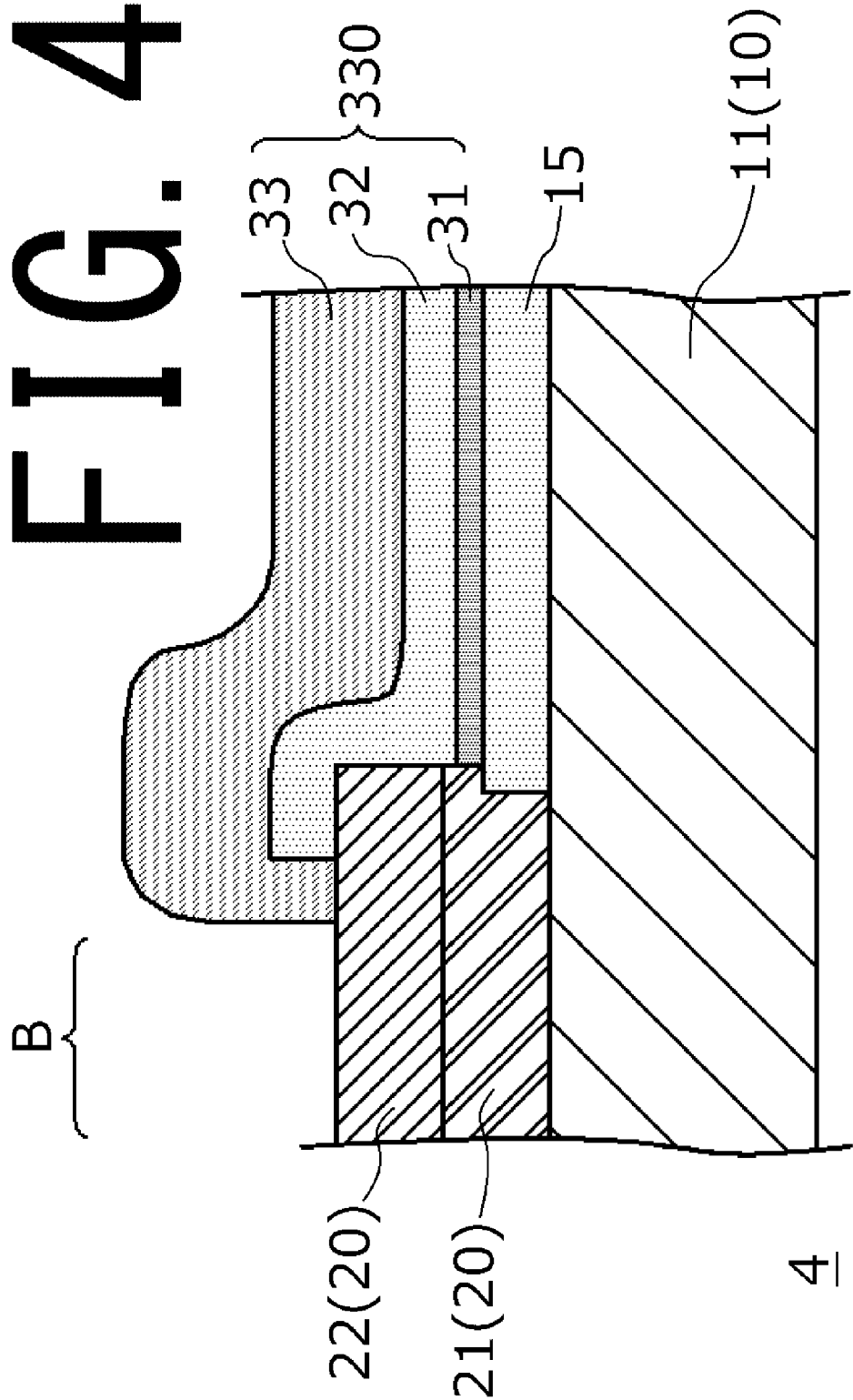

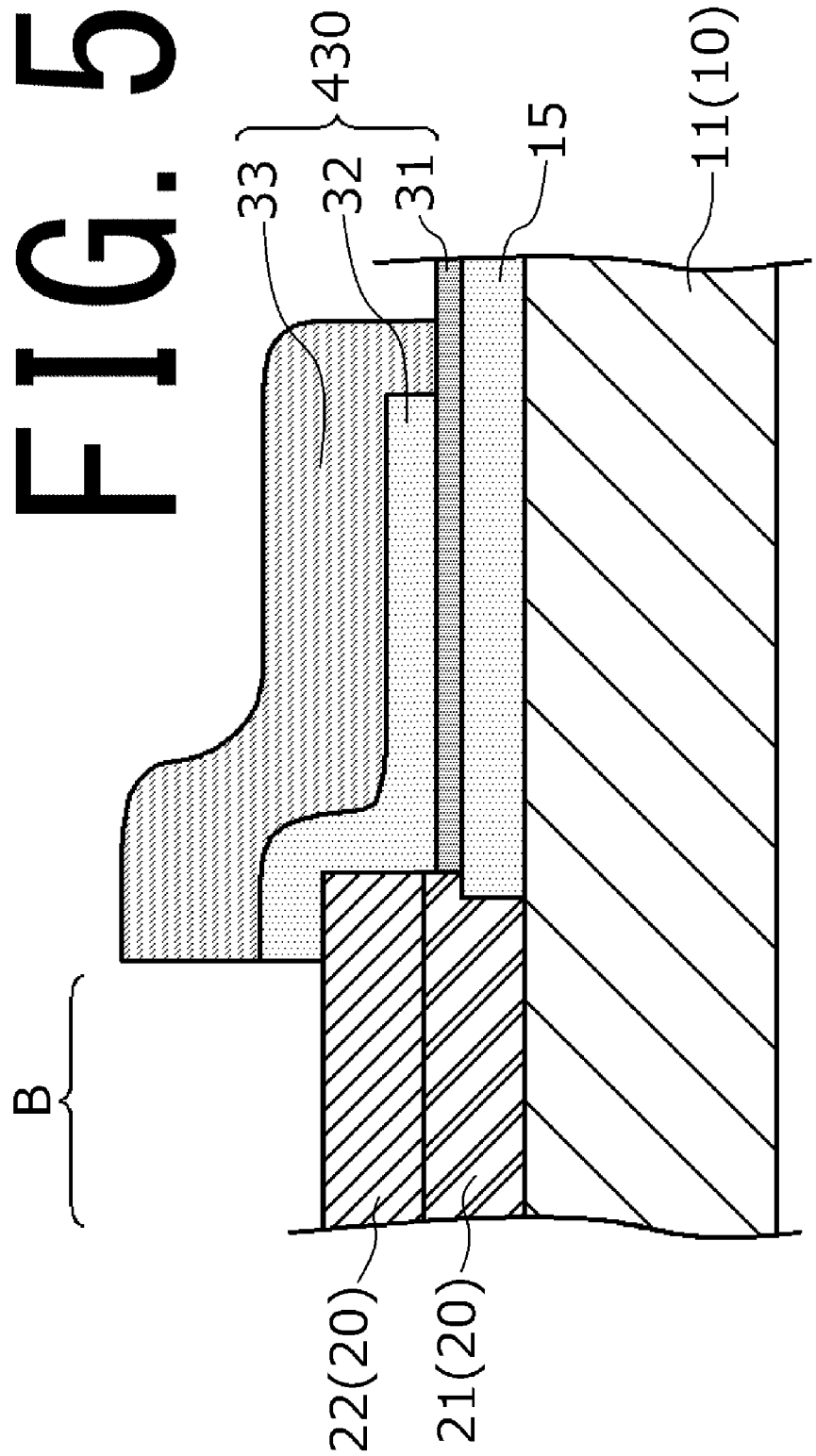

SEMICONDUCTOR DEVICE

INCORPORATION BY REFERENCE

This application is based on and claims the benefit of priority from Japanese Patent Application No. 2017-031102 filed on Feb. 22, 2017, the entire contents of which are hereby incorporated by reference.

BACKGROUND

The present invention relates to the construction of a semiconductor device in which a passivation layer is formed over an electrode.

In a semiconductor device in which a semiconductor element such as a diode, transistor and the like is formed on a semiconductor substrate, and an electrode (wire) is formed on the top of this, a passivation layer that includes an insulator is formed over most of the entire surface other than portions where the bonding wire of an electrode (bonding pad) is formed. By forming this kind of passivation layer, the semiconductor element is protected, and thus it is possible to stabilize the operation of the semiconductor element, and increase the reliability of the semiconductor device over a long period of time. This kind of passivation layer is particularly important in a power semiconductor device in which high voltage is applied and a large current flows.

A passivation layer, together with having high insulation property, requires having high humidity resistance and must be able to block impurities (ions) from having an adverse effect on the operation. Moreover, a passivation layer must also be able to perform sufficient mechanical protection of the semiconductor element. In order to obtain high humidity resistance and the ability to block impurities, being able to form a film on a semiconductor substrate as an insulating film that is dense is required, and as such material, silicon nitride film ($Si_3N_4$) is known. When a semiconductor substrate is made using a silicon-based material (Si, SiC), the elements of the silicon nitride film do not have an adverse effect on the operation of the semiconductor element, so using silicon nitride film is particularly preferred.

However, in order to obtain a high insulating property and to mechanically protect the semiconductor element, it is required that the passivation layer be made sufficiently thick. However, from the aspect of internal stress and adhesion of a typical silicon nitride film, peeling occurs easily, and forming a thick film is difficult so, forming a passivation layer made of only silicon nitride film is extremely difficult. Therefore, the construction described in patent literature 1 and 2 describes forming a silicon oxide film ($SiO_2$) that has less ability as a barrier than silicon nitride film because silicon oxide film is not dense, however can be formed to be thick and also has high insulating characteristics, so this silicon oxide film is formed to be thicker than the silicon nitride film and is layered on the silicon nitride film. In this case, the silicon nitride film and silicon oxide film can both be formed by a PCVD (plasma CVD) method or the like. Moreover, adhesion between the silicon oxide film and silicon nitride film is high, so it is difficult for peeling to occur between these films. Furthermore, an organic film that is formed on the very top surface of the passivation layer made of a polymer material such as a polyimide or the like is formed by coating or the like so as to be sufficiently thick. Adhesion between the organic film and the silicon oxide film is also high, so it is also difficult for peeling to occur between these films.

Moreover, when the semiconductor material of the semiconductor substrate is, for example, n-type silicon carbide (SiC), and the semiconductor element that is formed is a Schottky barrier diode, the Schottky electrode that comes in direct contact with the semiconductor material is made of titanium (Ti), molybdenum (Mo) or the like. These metal materials are effective for forming a Schottky barrier, however, the electrical resistance is not low, or the surface oxidizes easily, so these metals are not preferable as an electrode or wire material for electrical connection, or as a material for a bonding pad for connecting a bonding wire or the like. Therefore, as the electrode structure that is formed on top of a Schottky barrier diode, a metal layer that includes aluminum (A), gold (Au), copper (Cu) or the like that has low electrical resistance and is more suitable for use as a wire material is thickly formed, and as a result it is possible to obtain a Schottky barrier diode that has small parasitic resistance.

A passivation layer such as described above is formed so as to cover mostly an entire semiconductor substrate on which semiconductor elements are formed, and parts of a metal layer such as described above of an electrode is formed so as to be locally exposed from the passivation layer. This exposed portion of metal layer is used as a bonding pad for connecting to a bonding wire or the like. By using this kind of construction, it is possible to increase the reliability of a power semiconductor device. When doing this, in order to sufficiently prevent moisture and impurities from entering into the semiconductor side from the thick silicon oxide film or organic film side, layered construction such as described above in which the silicon nitride film is provided further on the bottom side (side near the semiconductor elements) is preferred.

RELATED LITERATURE

Patent Literature

[Patent Literature 1] JP2015170857 A
[Patent Literature 2] US Patent Application No. 2016/0093748

Problems to be Solved by Invention

In a power semiconductor device, current that flows during operation is large, so the amount of heat generated is large, so high endurance against thermal cycling is required. When a thick passivation layer is formed such as described above when thermal cycling is applied in this way, it becomes easy for cracking to occur in the passivation layer. Therefore, when a thick passivation layer is formed such as described above, the reliability of the semiconductor device decreases.

Taking into consideration the problems described above, the object of the present invention is to provide an invention that solves the problem points described above.

SUMMARY

The present invention is constructed as described below in order to solve the problems described above.

The semiconductor device of the present invention includes: a semiconductor substrate on which a semiconductor element is formed; an electrode layer that is formed on the top surface side of the semiconductor substrate, and is provided with a connection area on the surface thereof to which wiring is connected; and a passivation layer that covers the top surface side of the semiconductor substrate except for the connection area; wherein the electrode layer is constructed so as to include a metal wiring layer on the top surface side that forms the connection area; and the passivation layer has layered structure that includes: a first silicon nitride layer that includes silicon nitride and that is provided on the semiconductor substrate side; and a silicon oxide film that includes silicon oxide and that is formed on the top of the first silicon nitride layer; the end section of the first silicon nitride layer that faces toward the electrode layer side is arranged so as to be positioned on the outside of the end section of the metal wiring layer; and the silicon oxide film is continuously formed over the first silicon nitride layer and the metal wiring layer except for the connection area.

The semiconductor device of the present invention wherein the end section of the first silicon nitride layer that faces toward the electrode layer and the end section of the metal wiring layer are arranged so as to be separated.

In the semiconductor device of the present invention, nitrogen is added to the silicon oxide layer.

The semiconductor device of the present invention further includes a second silicon nitride layer that includes silicon nitride and that is formed on top of the silicon oxide layer and formed thicker than the first silicon nitride layer.

The semiconductor device of the present invention further includes an organic layer that includes a polymer material and that is formed on top of the silicon oxide layer and is formed thicker than the silicon oxide layer.

In the semiconductor device of the present invention, the organic layer covers an end section of the silicon oxide layer on the metal wiring layer.

In the semiconductor device of the present invention, the organic layer covers an end section of the silicon oxide layer in an area where the electrode layer is not formed.

In the semiconductor device of the present invention, the semiconductor element is a Schottky barrier diode; and the electrode layer has a layered structure that includes: a metal wiring layer; and a Schottky electrode layer that forms a Schottky barrier by coming in direct contact with semiconductor material of the semiconductor substrate on the bottom side of the metal wiring layer.

In the semiconductor device of the present invention, the Schottky electrode layer has an extending section that extends further toward the outside than the end section of the metal wiring layer; and the first silicon nitride layer is formed so as to cover the top surface of the extending section.

In the semiconductor device of the present invention, the metal wiring layer includes at least one of aluminum (Al), gold (Au), copper (Cu) and nickel (Ni).

Effect of Invention

The present invention is constructed as described above, so a highly reliable semiconductor device that uses a thick passivation layer can be obtained.

BRIEF DESCRIPTION OF THE DRAWINGS

FIG. 1 is a partial cross-sectional view of a semiconductor device of a first embodiment of the present invention.

FIG. 2 is a partial cross-sectional view of a semiconductor device of a second embodiment of the present invention.

FIG. 3 is a partial cross-sectional view of a semiconductor device of a third embodiment of the present invention.

FIG. 4 is a partial cross-sectional view of a semiconductor device of a fourth embodiment of the present invention.

FIG. 5 is a partial cross-sectional view of a semiconductor device of a fifth embodiment of the present invention.

DETAILED DESCRIPTION

In the following, a semiconductor device of embodiments of the present invention will be explained. This semiconductor device, as in the case of a typical semiconductor device, is such that a thick passivation layer that is formed using layered construction of a silicon nitride film, a silicon oxide film and an organic film is formed over a semiconductor substrate. Here, adhesion between the silicon nitride film and the silicon oxide film and between the silicon oxide film and the organic film is high, so it is difficult for peeling to occur. However, cracking that occurs when there is thermal cycling such as described above has been discovered to occur from the interface between the passivation layer and the electrode layer. This interface, more specifically, is an interface between the silicon nitride film in the passivation layer and the electrode layer that is formed using Al or the like. In this semiconductor device, this point is taken into consideration and suppresses peeling at this interface, and as a result, cracking of the passivation layer is suppressed.

First Embodiment

In the following, a semiconductor device of a first embodiment of the present invention will be explained. FIG. 1 is a partial cross-sectional view illustrating the construction of this semiconductor device. This semiconductor device 1 is a Schottky barrier diode that uses silicon carbide (SiC) as the semiconductor material. Therefore, the semiconductor substrate 10 that is made using SiC is used as the overall substrate.

In the semiconductor substrate 10, a drift layer (semiconductor layer) 11 that is made using n-type SiC is provided, and an insulation layer 15 that includes $SiO_2$ is formed on the surface of the drift layer 11. In an opening that is provided on the insulation layer 15, a Schottky electrode layer 21 is formed so as to directly come in contact with the drift layer 11. As the material of the Schottky electrode layer 21, Ti, Mo or the like is used as a metal material that forms a Schottky barrier with the n-type SiC. With this construction, a Schottky barrier diode is formed with an electrode (not illustrated in FIG. 1) that is connected to the rear-surface side of the drift layer 11 taken to be a cathode, and the Schottky electrode layer 21 side taken to be an anode. Moreover, by using $SiO_2$ as the material of the insulation layer 15 that comes in direct contact with the drift layer 11, it is possible to make the interface state density at the interface of the drift layer 11 small. As a result, it is possible to improve the characteristics of the Schottky barrier diode, such as reducing the reverse current. The surface area at the Schottky junction is determined according to the opening section that is provided in the insulation layer 15.

In FIG. 1, layers that are lower than the drift layer 11 of the semiconductor substrate 10 that includes the cathode electrode and the like are not related to the invention of the present application, so a description thereof is omitted. Moreover, there are also cases in which other layers (p-type layer and the like) in the drift layer 11, for example, may be formed on the surface (surface on the top side in FIG. 1) of the semiconductor substrate 10, however, those layers are not related to the invention of the present application, so for simplicity, only the drift layer 11 will be described here.

The thickness of the Schottky electrode layer 21 is thick enough so that a good Schottky junction can be formed with the drift layer 11, and for example, is as thin as 100 nm, and a thick metal wiring layer 22 is formed on the top thereof. The metal wiring layer 22 is formed to be as thick as 4 μm, for example, and is formed using a material such as Al, Au, Cu and like that has low electrical resistance, so it is possible to lower the overall electrical resistance of the electrode layer 20 that is formed having a layered structure of a Schottky layer 21 and metal wiring layer 22. Moreover, it is possible to directly connect bonding wire or the like to the top of the metal wiring layer 22. It is also possible to form a thin nickel (Ni) layer on the surface of the metal wiring layer 22 using plating or the like. Furthermore, in order to make the characteristics as an electrode material even more preferable, it is possible, instead of using only Al, Au, Cu and the like, to form the metal wiring layer 22 using alloys that uses these metals as the main component. Moreover, other metal layers (metal barrier layer) may also be provided between the Schottky electrode layer 21 and the metal wiring layer 22. In FIG. 1, an area that includes the end section of the electrode layer 20 of the semiconductor device 1 is partially illustrated.

In this semiconductor device 1, a thick passivation layer 30 is formed from the area on the right side of FIG. 1 where the Schottky electrode layer 21 and metal wiring layer 22 are not formed to the area on the top side of the metal wiring layer 22 on the left side. Actually, the passivation layer 30 is formed so as to cover most of the entire surface of the semiconductor substrate 10, and only an area of part of the metal wiring layer 22 (connection area B in FIG. 1) is open. The connection area B is used as a bonding pad to which wiring (bonding wire and the like) from the outside is connected. The metal wiring layer 22 is exposed in the connection area B.

The passivation layer 30 includes starting from the bottom side a first silicon nitride film (first silicon nitride layer) 31 that is made using silicon nitride ($Si_3N_4$), a silicon oxide layer (silicon oxide layer) 32 that is made using silicon oxide ($SiO_2$) (silicon oxide layer) 32, and an organic film (organic layer) 33 that is made using a polyimide (polymer material). The thickness of the first silicon nitride film 31 is about 100 nm, the thickness of the silicon oxide film 32 is thicker than this and is about 300 nm, and the thickness of the organic film 33 is much thicker than this and is about 3 μm. The $Si_3N_4$ of the first silicon nitride film 31 and the $SiO_2$ of the silicon oxide film 32 are each materials in the case of stoichiometric composition, and actually the compositions of these materials vary depending on the film forming conditions and the like, and typically the compositions are not exactly $Si_3N_4$ and $SiO_2$. Here, the compositions of these materials will be indicated as being $Si_3N_4$ and $SiO_2$ in this way and includes cases other than the stoichiometric composition. The first silicon nitride film 31 and the silicon oxide film 32 are both formed by a plasma CVD (PCVD) method. The compositions described above can be controlled by the film forming conditions.

In FIG. 1, the silicon oxide film 32 and the organic film 33 are formed so as to cover the top of the insulation layer 15 and the electrode layer 20 (metal wiring layer 22) except for the connection area B, however, the first silicon nitride layer 31 is formed only on the insulation layer 15 and is not formed on the electrode layer 20 (metal wiring layer 22). Therefore, the end section of the first silicon nitride film 31 that faces toward the electrode layer 20 side and the end section of the metal wiring layer 22 are not connected and are separated.

Here, generally, adhesion strength between the silicon oxide film 32 that includes $SiO_2$ that that is less dense than $Si_3N_4$ and the metal wiring layer 22 that includes metal material such as Al, Au, Cu and the like is high, and the adhesion strength of the silicon oxide film is high. However, adhesion strength between the first silicon nitride film 31 that includes $Si_3N_4$ that is highly dense and the metal wiring layer 22 that includes material such as described above is low, and the adhesion strength of the first silicon nitride film 31 is low. Moreover, the adhesion strength between the insulation layer 15 and silicon oxide film 32 that includes $SiO_2$ and the first silicon nitride film 31 is high.

In the construction illustrated in FIG. 1, the first silicon nitride film 31 and the metal wiring layer 22 do not come in direct contact, and only the silicon oxide film 32 comes in direct contact with the metal wiring layer 22. Therefore, the adhesion at all of the interfaces that are formed in the structure illustrated in FIG. 1 is high, and it is difficult for peeling to occur.

However, in the structure illustrated in FIG. 1, it is difficult for both moisture and impurities to penetrate the Schottky electrode layer 21 and the metal wiring layer 22 that include metal, and areas where the Schottky electrode layer 21 and metal wiring layer 22 are not formed in the plan view are covered with the dense first silicon nitride film 31. Therefore, a barrier characteristic is obtained by the passivation layer 30, and it becomes difficult for cracking to occur in the passivation layer 30.

As described above, in order to make it difficult for cracking to occur in the passivation layer 30, make the barrier characteristic provided mainly by the first silicon nitride film 31 high, maintain the insulation characteristic provided mainly by the silicon oxide film 32 and organic film 33, and maintain the mechanical protective ability to protect the semiconductor elements, it is particularly preferred that the film thickness of the first silicon nitride film 31 be within the range 50 to 10000 nm, the film thickness of the silicon oxide film 32 be within the range 200 to 30000 nm, and the film thickness of the organic film 32 be within the range 1 to 10 μm.

In the construction above, as described, even though adhesion strength between the first silicon nitride film 31 and the silicon oxide film 32 that includes $SiO_2$ is high, internal stress occurs in each of these layers during film formation, and particularly, when forming the silicon oxide film 32 to be thick, this internal stress increases, and when, for example, the direction of the internal stress of the first silicon nitride film 31 directly below is opposite, it become easy for peeling to occur between both of these films.

In such a case, the silicon oxide film that includes $SiO_2$ as described above can be replaced with a silicon oxynitride film (SiON) that is formed by adding nitrogen to 502. SiON, similar to $SiO_2$ and $Si_3N_4$, can be formed by a PCVD method, and the properties are intermediate between $SiO_2$ and $Si_3N_4$. Therefore, an increase of internal stress between the SiON film and the first silicon nitride film 31 as described above is suppressed, and it becomes difficult for peeling to occur between the SiON film and the first silicon nitride film 31. It is not necessary for the composition of the silicon oxynitride film to be exactly SiON, and being able to control the exact composition by the film forming conditions is the same as in the case of $Si_3N_4$ and $SiO_2$.

Second Embodiment

FIG. 2 is a cross-sectional view similar to FIG. 1 and illustrates the construction of a semiconductor device 2 of a second embodiment. In this semiconductor device 2 as well, the same semiconductor substrate 10 as in the semiconductor device 1 is used, and an insulation layer 15 is similarly formed. Moreover, a Schottky electrode layer 21 is also formed the same as in FIG. 1. However, in the electrode layer 120 that is used in this semiconductor device 2, the metal wiring layer 22 in the plan view is set to be smaller than in the Schottky electrode layer 21. Therefore, on the outside of the metal wiring layer 22 (right side in FIG. 2), the Schottky electrode layer 21 has an extending section E that extends further than the metal wiring layer 22. Along with this, the structure of the passivation layer 130 that is used here is different from that of the passivation layer 30 above.

In the semiconductor device 1 above, the first silicon nitride film 31 is only formed on the insulation layer 15, however, in this semiconductor device 2, the first silicon nitride film 31 is continuously formed on the insulation layer 15 and also on the extending portion E of the Schottky electrode layer 21. However, the aspect of not forming the first silicon nitride film 31 on the metal wiring layer 22 is the same as in the semiconductor device 1 above.

As described above, adhesion between the metal wiring layer 22 that includes Al, Au. Cu and the like, and the first silicon nitride film 21 is not good, however, adhesion between the Schottky electrode layer 21 that includes Ti, Mo and the like and the first silicone nitride film 21 is better than this. Moreover, as described above, the internal stress in each layer is related to peeling, and the effect of this becomes more noticeable when each layer is thick. Typically, the internal stress of the metal wiring layer 22 that is formed to be thick is often larger than the internal stress of the Schottky electrode layer 21 that is formed to be thin. Therefore, it is easy for peeling to occur when the first silicon nitride film 31 and the metal wiring layer 22 are in direct contact, however, it is not easy for peeling to occur even when the first silicon nitride film 31 and the Schottky electrode layer 21 are in direct contact.

Therefore, in this semiconductor device 2 as well, the aspect of it being difficult for peeling of the passivation layer 130 to occur is the same. On the other hand, the aspect of being able to use the area of the metal wiring layer 22 that is not covered by the passivation layer 130 as a bonding pad is the same, and obtaining a high barrier characteristic by the first silicon nitride film 31 is also the same. In this structure, the electrode layer 120 is also partially covered by the first silicon nitride film 31, so the barrier characteristic by the passivation layer 130 (first silicon nitride film 31) becomes even higher than in the semiconductor device 1 above.

Moreover, When a metal barrier layer is provided between the Schottky electrode layer 21 and the metal wiring layer 22 as described above, and when the adhesion strength between the metal barrier layer and the first silicon nitride film 31 is high, the metal barrier layer should have the same shape as the Schottky electrode layer 21 in FIG. 1, and the first silicon nitride film 31 should cover part of the metal barrier layer. However, when the adhesion strength between the metal barrier layer and the first silicon nitride film 31 is low, the metal barrier layer should have the same shape as the metal wiring layer 22 in FIG. 2, and the first silicon nitride film 31 and the metal barrier layer should not come in direct contact.

Third Embodiment

FIG. 3 is a cross-sectional view that correlates the structure of the semiconductor device 3 of a third embodiment with FIG. 1 and FIG. 2. The semiconductor substrate 10 that is used here is the same as that described above, and the electrode layer 120 that includes a Schottky electrode layer 21 and a metal wiring layer 22 is the same as in the semiconductor device 2 above. Correspondingly, the structure of the first silicon nitride film 31 that is the very bottom layer of the passivation layer 230 that is used here, and the silicon oxide film 32 on that are also the same as in the semiconductor device 2 (passivation layer 130) above.

In this passivation layer 230, a second silicon nitride film (second silicon nitride layer) 41 that includes $Si_3N_4$ the same as the first silicon nitride film 31 is formed on the silicon oxide film 32, and an organic film 33 is formed on that. The second silicon nitride film 41 can be formed in the same way as the first silicon nitride film 31 by a PCVD method or the like. Here, the film thickness of the second silicon nitride film 41 is thicker than the first silicon nitride film 31.

As described above, even though it is difficult for peeling of the first silicon nitride film 31 to occur in the structure above, the thinner the film thickness of the first silicon nitride film 31 is, the more difficult it is for peeling to occur, so preferably this film thickness is thin. However, in order to increase the barrier characteristic by the silicon nitride film, preferably the silicon nitride film is made to be thick. In the construction illustrated in FIG. 3, by further providing the second silicon nitride film 41 on the top side of the silicon oxide film 32, the total film thickness of the silicon nitride film is increased, and the barrier characteristic is strengthened. In this case, the second silicon nitride film 41 does not come in direct contact with the metal wiring layer 22, and the adhesion strength between the second silicon nitride film 41 and the silicon oxide film 32 is high, so it is difficult for peeling of the second nitride film 41 to occur.

Moreover, when peeling occurs based on the difference between the internal stresses of the metal wiring layer 22 and the silicon nitride film, preferably the spacing between each is large when the metal wiring layer 22 and the silicon nitride film are not in direct contact. In this regard, there is a thick silicon oxide film 32 between the second silicon nitride film 41 and the metal wiring layer 22, so the effect of the metal wiring layer 11 on the second silicon nitride film 41 becomes small. Therefore, the second silicon nitride film 41 can be formed to be thicker than the first silicon nitride film 31, for example. As a result, the barrier characteristic by this passivation layer 230 can be further increased. Alternatively, the barrier characteristic by the second silicon nitride film 41 can be increased, so with the barrier characteristic maintained, the film thickness of the first silicon nitride film 31 can be made thin. Consequently, peeling of the first silicon nitride film 31 can be further suppressed.

Therefore, when providing a second silicon nitride film 41, it is particularly preferred that the film thickness of the first silicon nitride film 31 be within the range 50 to 1000 nm, and the film thickness of the second silicon nitride film 41 be within the range 1000 to 2000 nm.

Moreover, in the construction illustrated in FIG. 3, the organic film 33 is formed over the second silicon nitride film 41, however, a silicon oxide film may be further formed over the second silicon nitride film 41, and then an organic film may be formed of that silicon oxide film. Furthermore, it is also possible to alternately layer a large number of silicon oxide films and silicon nitride films.

In the first thru third embodiments, when protection of the semiconductor elements can be sufficiently performed without using an organic film 33, the organic film 33 is not necessary. Alternatively, it is similarly possible to use a film that is made using other material that can be formed to be thick and that has high insulation characteristics instead of the organic film 33.

Fourth Embodiment

FIG. 4 is a cross-sectional view that correlates the structure of the semiconductor device 4 of a fourth embodiment with FIG. 1. Except for the passivation layer 330, the construction used here is the same as that used in the semiconductor device 1 (passivation layer 30) above.

In this passivation layer 330, on top of the electrode layer 20 (metal wiring layer 22) in the center and left side of FIG. 4, the organic film 33 that is the very top layer is formed so as to extend further to the left side than the silicon oxide film 32. As a result, the end section on the left side of the silicon oxide film 32 is covered by the organic film 33.

The organic film 33 that includes polyimide and the like can be thickly formed by coating and the like, and the adhesion strength between the organic film 33 and the metal wiring layer 22 is also high. Moreover, when a photosensitive polyimide is used, for example, the patterning of the organic film can be easily performed by exposure and development. Therefore, the structure in FIG. 4 can be easily manufactured.

In this structure, even supposing peeling occurs at the interface between the silicon oxide film 32 and the metal wiring layer 22, this portion is covered by the thick organic layer 33 so the progression of cracking due to this peeling is suppressed. Alternatively, these interfaces are covered by the thick organic film 33 so it is difficult for peeling to occur. Moreover, in FIG. 4, the penetration of moisture, impurities and the like from the end section on the left side of the silicon oxide film 32 that is thickly formed and that does not have a dense structure is suppressed by the thick organic film 33. Therefore, reliability of this semiconductor device 4 can particularly be increased.

Fifth Embodiment

FIG. 5 is a cross-sectional view that correlates the structure of the semiconductor device 5 of a fifth embodiment with FIG. 1. Except for the passivation layer 430, the construction that is used here is the same in the semiconductor devices 1 and 4 above. Here, differing from FIG. 1 to FIG. 4, the end section on the side separated from the electrode layer 20 of the passivation layer 430 is illustrated.

In this passivation layer 430, on the top of the insulation layer 15 on the right side in FIG. 5, the organic film 33 that is the very top layer is formed so as to extend further toward the right side than the silicon oxide film 32. As a result, the end section on the right side of the silicon oxide film 32 is covered by the organic film 33.

In doing so, even supposing that peeling occurs at the interface between the silicon oxide film 32 and the first silicon nitride film 31, this portion is covered by the thick organic film 33, so progression of cracking due to this peeling is suppressed. Alternatively, these interfaces are covered by the thick organic film 33 so it is difficult for peeling to occur. Moreover, in FIG. 5, the penetration of moisture, impurities and the like from the end section on the right side of the silicon oxide film 32 that is thickly formed and that does not have a dense structure is suppressed by the thick organic film 33. Therefore, reliability of this semiconductor device 5 can particularly be increased.

By suitably combining the first thru fifth embodiments above, it is possible to even further improve the reliability of a semiconductor device. For example, it is possible to combine the fourth embodiment (structure in which the organic film 33 extends over the electrode layer 20) or the fifth embodiment (structure in which the organic film 33 extends over the insulation layer 15) with the third embodiment (structure in which a second silicon nitride film 41 is used). Moreover, it is also possible to use a structure that combines the fourth embodiment with the fifth embodiment (structure in FIG. 4 and FIG. 5 in which the organic film 33 extends toward both the left and right sides).

Moreover, in the structure above, a Schottky barrier diode was presumed to be formed in the semiconductor device, however, in other semiconductor elements, for example, in a MOSFET (power MOSFET) as well, as long as a passivation layer is formed that covers the surface except in areas where a metal wiring layer (electrode) comes in contact with the surface, the construction described above is effective. For example, when plural metal layers (bonding pads) are provided that are exposed from the passivation layer, it is possible to form a passivation layer so that the structures in FIGS. 1 to 4 are realized for each bonding pad. In this case, the metal of the semiconductor substrate 10 side of the electrode layer 20 is not limited to a Schottky electrode and can be formed using a metal (for example Ti, Ni, or the like) that can form good ohmic contact with the semiconductor substrate 10. Moreover, instead of SiC, it is possible to use Si and various compound semiconductors as the material of the semiconductor substrate.

Moreover, in the construction above, $Si_3N_3$ or an insulator whose composition deviates from the stoichiometric composition is used as the material of the first and second silicon nitride films, and $SiO_2$, SiON or an insulator whose composition deviates from the stoichiometric composition is used as the material of the silicon oxide film. However, as long as a higher barrier characteristic than the silicon oxide film is obtained by the first and second silicon nitride films, it is more difficult for peeling to occur in the silicon oxide film than the first silicon nitride film, and good insulation is obtained by these layers, other substances may be added to each of the materials described above. Moreover, when plural silicon nitride layers and silicon oxide layers are used in a layered structure, the composition of each silicon nitride layer and each silicon oxide layer does not need to be the same.

EXPLANATION OF REFERENCE NUMBERS 1, 2, 3, 4, 5 Semiconductor device
10 Semiconductor substrate
11 Drift layer (semiconductor layer)
15 Insulation layer
20, 120 Electrode layer
21 Schottky electrode layer
22 Metal wiring layer
30, 130, 230, 330, 430 Passivation layer
31 First silicon nitride film (first silicon nitride layer)
32 Silicon oxide film (silicon oxide layer)
33 Organic film (organic layer)
41 Second silicon nitride film (second silicon nitride layer)
B Connection area
E Extending section

What is claimed is:
1. A semiconductor device comprising:
 a semiconductor substrate on which a semiconductor element is formed;
 an electrode layer that is formed on a top surface side of the semiconductor substrate, and is provided with a connection area on a surface thereof to which wiring is connected; and a passivation layer that covers the top surface side of the semiconductor substrate except for the connection area; wherein the electrode layer has a layered structure that includes a metal wiring layer on the top surface side that forms the connection area and another layer in direct contact with a semiconductor material of the semiconductor substrate and provided on the bottom side of the metal wiring layer;

the passivation layer has another layered structure that includes:

a first silicon nitride layer that includes silicon nitride and that is provided on the top surface side of the semiconductor substrate; and a silicon oxide film that includes silicon oxide and that is formed on top of the first silicon nitride layer;

the first silicon nitride layer comprises an end section that faces toward a side of the electrode layer and is arranged so as to be positioned on the outside of an end section of the metal wiring layer;

the silicon oxide film is continuously formed over the first silicon nitride layer and the metal wiring layer except for the connection area;

the another layer in direct contact with the semiconductor material in the layered structure of the electrode layer has an extending section that extends further toward the outside than the end section of the metal wiring layer; and the first silicon nitride layer is formed so as to cover a top surface of the extending section.

2. The semiconductor device according to claim 1, wherein the end section of the first silicon nitride layer that faces toward the electrode layer and the end section of the metal wiring layer are arranged so as to be separated.

3. The semiconductor device according to claim 1, wherein nitrogen is added to the silicon oxide layer.

4. The semiconductor device according to claim 1 further comprising a second silicon nitride layer that includes silicon nitride and that is formed on top of the silicon oxide layer and formed thicker than the first silicon nitride layer.

5. The semiconductor device according to claim 1, further comprising an organic layer that includes a polymer material and that is formed on top of the silicon oxide layer and is formed thicker than the silicon oxide layer.

6. The semiconductor device according to claim 5, wherein the organic layer covers an end section of the silicon oxide layer on the metal wiring layer.

7. The semiconductor device according to claim 5, wherein the organic layer covers an end section of the silicon oxide layer in an area where the electrode layer is not formed.

8. The semiconductor device according to claim 1 wherein the metal wiring layer includes at least one of aluminum (Al), gold (Au), copper (Cu) and nickel (Ni).

9. The semiconductor device according to claim 1, wherein the another layer in direct contact with the semiconductor material in the layered structure of the electrode layer forms a Schottky barrier by coming in direct contact with the semiconductor material.

10. The semiconductor device according to claim 9 wherein the metal wiring layer includes at least one of aluminum (Al), gold (Au), copper (Cu) and nickel (Ni).

* * * * *